(12) United States Patent
Rotella

(10) Patent No.: US 7,135,366 B2
(45) Date of Patent: Nov. 14, 2006

(54) METHOD FOR FABRICATING A LATERAL METAL-INSULATOR-METAL CAPACITOR

(76) Inventor: Francis M. Rotella, 710 Santa Maria Dr., Irvine, CA (US) 92606

( * ) Notice: Subject to any disclaimer, the term of this patent is extended or adjusted under 35 U.S.C. 154(b) by 2 days.

(21) Appl. No.: 10/738,256

(22) Filed: Dec. 17, 2003

(65) Prior Publication Data

US 2005/0133848 A1 Jun. 23, 2005

(51) Int. Cl.
*H01L 21/20* (2006.01)
(52) U.S. Cl. .................. 438/238; 438/381; 438/393

(58) Field of Classification Search ............ 438/238, 438/381, 393
See application file for complete search history.

(56) References Cited

U.S. PATENT DOCUMENTS 5,583,359 A * 12/1996 Ng et al. ................... 257/306
6,385,033 B1 * 5/2002 Javanifard et al. ......... 361/306.2

* cited by examiner

*Primary Examiner*—Thanh Nguyen
(74) *Attorney, Agent, or Firm*—Jack Jmaev

(57) ABSTRACT

A lateral metal-insulator-metal capacitor fabricated with consistent dummy fill and slotting patterns that assure predictable and controlled performance from the metalization layout while conforming to process design rules.

10 Claims, 8 Drawing Sheets

METHOD FOR FABRICATING A LATERAL METAL-INSULATOR-METAL CAPACITOR

FIELD OF THE INVENTION

The present invention relates generally to the design of passive integrated circuit elements and particularly to the design of an integrated capacitor with predictable performance characteristics.

BACKGROUND OF THE INVENTION

It is paradoxical that, historically, that is to say before the 1950's, the largest elements in an electronic circuit tended to be the active elements. At that time, active elements took the form of expensive vacuum tubes. Vacuum tubes consumed copious amounts of power. Vacuum tubes operated at dangerously high voltages. Vacuum tubes generated very large amounts of heat. The cost of vacuum tubes dominated the parts cost of a product. Resistors and capacitors in those systems were relatively small. The effect of resistors and capacitors upon the size and cost of a product was almost negligible.

Today the situation is nearly exactly reversed. Semiconductor chips (integrated circuits) exist that include upward of 100 million transistors are commonplace. Transistors are the active elements in today's electronic devices that replace the vacuum tubes of pre-1950's electronics. Transistors are extremely small. Transistors consume microscopic amounts of power. Transistors operate at very low voltages. Transistors cost almost nothing. The effect of a single transistor on the design of a very large scale integration (VLSI) chip is virtually invisible. The paradox, then, is that resistors and capacitors now are relatively large when compared with the size of a single transistor.

Resistors and capacitors are very difficult to fabricate as part of integrated circuits. Even though resistors and capacitors may appear to be small to the naked eye, they occupy relatively large amounts of valuable area on an integrated circuit. This area might better be populated with transistors. For this reason, resistors and capacitors often appear in electronic circuits as discrete elements. Discrete elements are elements that stand alone on printed circuit boards outside VLSI chips.

Even so, situations do arise where it is necessary and desirable to fabricate, for example, a capacitor as part of a semiconductor integrated circuit. In these instances, every effort is made to keep the capacitor small and to squeeze it into as small an area as possible. The traditional textbook diagram of a basic capacitor shows two metal parallel plates (a first plate and a second plate). The plates are placed closely together with insulation (called dielectric material) between them. A terminal is attached to each plate. The capacitor functions by storing equal and opposite amounts of electrical charge on its opposite plates. A capacitor is characterized in part by its "capacitance." Capacitance is a parameter that increases as the area of the plates increases and that further increases as the distance between the plates decreases. The value of the capacitance also is affected by the characteristics of the dielectric material that separates the two plates. Practical stand-alone capacitors can be fabricated, for example, from two sheets (a first sheet and a second sheet) of foil. The two sheets of foil are wrapped tightly together. An insulating layer is placed between the sheets. A terminal is attached to each sheet. The larger the area of the sheets and the thinner the insulating layer, the larger the capacitance. The picture to be grasped here is the concept that two metallic surfaces separated by insulating (dielectric) material form a capacitor.

Sometimes capacitance in a circuit is designed in on purpose and is therefore desirable. In other situations, capacitance arises incidentally. For example, any time two metallic surfaces lie close to each other, some amount of capacitance results. In integrated circuits, nearly invisible wires may run near each other for some distance. Even these tiny pairs of wires sometimes give rise to "parasitic" capacitance. Parasitic capacitance normally is considered to be undesirable. In still other situations, this effect of parasitic capacitance can be used to advantage. For example, a circuit may require a capacitor. If so, then one method for creating a capacitor comprises intentionally introducing some parasitic capacitance. Indeed, techniques for fabricating such capacitors have evolved to become quite sophisticated.

One form of capacitor fabricated in an integrated circuit by one technique is called a lateral metal-insulator-metal (LMIM) capacitor. An LMIM capacitor can be fabricated by constructing metallic fingers (like the tines of a fork) that interleave with each other to create a capacitive effect. The tines of one fork play the role of the first plate in the textbook version of a capacitor; the tines of the other fork play the role of the second plate. Some integrated circuits repeat this basic structure on several layers of the integrated circuit in order to increase the effective area of the plates of the capacitor being fabricated. Even so, only two groups of fingers are used, one group being connected together by wires or other means to form a first plate of the capacitor; the second group being connected together to form a second plate. When fabricated, the fingers of each plate resemble the bristles of a coarse hairbrush. The capacitor is formed by facing two "hairbrushes" together so that the two sets of "bristles" overlap while taking care to assure that the bristles of one hairbrush are insulated from the bristles of the other.

Although the mathematics can become complicated, design engineers are able to calculate the capacitance of these LMIM structures. By controlling the size, number of fingers, type of dielectric material and so on, a capacitor with a desired amount of capacitance can be designed quite precisely. However, while certain parasitic effects are exploited to design an LMIM capacitor, other parasitic effects act to frustrate the efforts of the circuit designer. These parasitic effects make it difficult to predict the value of capacitance that results in a given circuit design.

These other parasitic effects arise because of the proximity of an LMIM capacitor to other elements in the circuit that are not part of the LMIM capacitor itself. Thus, the capacitance of an LMIM capacitor can be influenced by factors outside the control of the LMIM capacitor designer.

The design of an integrated circuit is governed, in part, by a set of design rules to which circuit designers must adhere. One such set of rules governs the amount of metal that can appear in each layer of an integrated circuit. Integrated circuits typically are fabricated in layers with four, five, or six layers being employed in some embodiments. If a basic circuit design does not comprise sufficient metal to satisfy the design rules, then a "dummy fill" algorithm is used to add "islands" of metal in unused areas of each layer of the circuit in order to satisfy the design rules. Conversely, if a layer (such as a ground or power plane) comprises too much metal, then a "slotting" algorithm is employed to remove metal by creating slots in the existing metal, again, in order to satisfy the design rules. The slotting and dummy fill algorithms in the prior art do not take into account the structure of circuit elements near the slotting or dummy fill areas. In particular, the slotting and dummy fill algorithms insert and remove metal essentially randomly in the neighborhood of an LMIM capacitor. As a result, two identically designed LMIM capacitors placed in different regions of an integrated circuit can exhibit different performance because of the different parasitic effects present in each region. Further, the prior art gives the LMIM capacitor designer no means by which to correct this undesirable situation.

SUMMARY OF THE INVENTION

The present invention addresses the problem of the variability of the performance of electronic elements caused by following the conventional slotting and dummy fill algorithms used in the prior art for controlling average metal density in integrated circuits. One illustrative method of the present invention applies to the fabrication of a lateral metal-insulator-metal (LMIM) capacitor. This illustrative method comprises selecting a predetermined number of metal layers for an integrated circuit design process. This illustrative method further comprises selecting a subset of layers from the predetermined metal layers for use in fabricating a lateral metal-insulator-metal capacitor. One layer, called the first layer, is selected from this subset. This illustrative method still further comprises imparting an active interdigitated finger pattern on the selected subset of layers, said interdigitated finger pattern having a first terminal and a second terminal. This illustrative method still further comprises defining a first consistent dummy pattern on said first layer within the confines of the active interdigitated finger pattern. The present variation still further comprises imparting the first consistent dummy pattern on the remaining layers. According to one alternative example method of the present invention, defining a first consistent dummy pattern comprises defining an alternating metal pattern within the overlap portion of the interdigitated finger pattern.

According to another alternative variation of the present method, a second consistent dummy pattern further is defined around the periphery of the active interdigitated finger pattern. This alternative variation of the present method still further comprises imparting the second consistent dummy pattern to all metal layers in the design. Yet another alternative variation of the present method comprises defining a second consistent dummy pattern by defining a border region free of metal of approximately one to four times the thickness of the dielectric layer between the top-most metal layer in the selected subset and the layer directly above that layer. According to one aspect of this alternative variation, the border region extends about the periphery of the interdigitated finger pattern and along interconnect feed-lines to the terminals thereof. Another aspect of this alternative variation comprises defining an alternating metal pattern that extends outward from the border region. Yet another aspect of this alternative variation of the present method teaches that the alternating metal pattern is imparted onto all of the layers in an offset manner consistent with process design rules.

One other alternative variation of the present method further comprises providing a ground plane, said ground plane disposed to lie substantially under the bottom-most layer of the selected subset of layers. This alternative variation further comprises defining an electrical connection from the first terminal to the ground plane. According to another alternative variation of the present method, a slotting pattern further is defined for placing voids in the ground plane. These voids are placed to avoid the second terminal of the interdigitated finger pattern. Yet another alternative variation of the present method comprises defining an electrical connection from the first terminal to the ground plane. This electrical connection comprises defining a plurality of vias from a finger on said first terminal to the ground plane wherein the placement of the vias alternates with the placements of the voids. A via is a metal connection path that extends from one layer of an integrated circuit to another. This alternative variation of the present method further comprises defining a plurality of vias from a base of the first terminal to the ground plane.

One embodiment of the present invention comprises a lateral metal-insulator-metal (LMIM) capacitor fabricated according to the method described herein. One example embodiment of the LMIM capacitor comprises an active interdigitated finger pattern imparted onto a selected set of subset of layers comprising a first layer. The subset of layers is selected from a predetermined number of metal layers selected for an integrated circuit design process. The subset of layers is chosen for fabricating an LMIM capacitor. The active interdigitated finger pattern in the present embodiment comprises a first terminal and a second terminal. This embodiment further comprises a first consistent dummy pattern defined on said first layer of the subset within the confines of the active interdigitated finger pattern. The embodiment still further comprises said first consistent dummy pattern imparted on the remaining metal layers.

According to one alternative embodiment of the LMIM capacitor, the first consistent dummy pattern comprises an alternating metal pattern defined within the overlap portion of the interdigitated finger pattern. Another alternative embodiment of the LMIM capacitor further comprises a second consistent dummy pattern placed around the periphery of the active interdigitated finger pattern. The second consistent dummy pattern is imparted to all metal layers. According to yet another alternative embodiment of the LMIM capacitor, the second consistent dummy pattern comprises a border region free of metal. The border region so defined is approximately one to four times the thickness of the dielectric layer between the topmost metal layer in the selected subset and the layer directly above that layer about the periphery of the interdigitated finger pattern and along interconnect feed-lines to the terminals thereof. This alternative embodiment of the LMIM capacitor further comprises an alternating metal pattern that extends outward from the border region. This alternating metal pattern is imparted onto all of the metal layers in an offset manner consistent with process design rules.

One more alternative embodiment of the LMIM capacitor further comprises a ground plane. The ground plane is disposed substantially under the bottom-most layer of the selected subset of layers. This alternative embodiment further comprises an electrical connection from the first terminal to the ground plane. Yet another alternative embodiment of the LMIM capacitor comprises voids placed in the ground plane according to a slotting pattern that avoids the second terminal of the interdigitated finger pattern. Yet one more embodiment of the LMIM capacitor comprises an electrical connection from the first terminal to the ground plane. This electrical connection comprises a plurality of vias from a finger on said first terminal to the ground plane. The placements of the vias alternate with the placement of the voids. This connection further comprises a plurality of vias from a base of the first terminal to the ground plane.

BRIEF DESCRIPTION OF THE DRAWINGS

The present invention will hereinafter be described in conjunction with the appended drawings and figures, wherein like numerals denote like elements, drawings are not to scale, and in which.

DETAILED DESCRIPTION OF THE INVENTION

The present invention addresses the problem of variability in the performance of a lateral metal-insulator-metal (LMIM) capacitor. One source of this variability is the prior art slotting and dummy fill algorithms. These algorithms are used to meet process design requirements regarding average density of metal in each layer of an integrated circuit. These prior art slotting and dummy fill algorithms do not take into account the structure of nearby elements. Therefore, the prior art algorithms provide no control of parasitic effects. As already described, parasitic effects can influence the performance of LMIM capacitors in unpredictable ways. The method of the present invention comprises steps that, according to one example variation, modify the design procedure for LMIM capacitors. These modifications make the placement of dummy fill and slots part of the process of designing the capacitor. According to another variation of the method, the placement of dummy fill and slots is included as part of the process of designing other electronic elements. These elements include, but are not restricted to, resistors, inductors, transformers, and gyrators.

Figure 1:
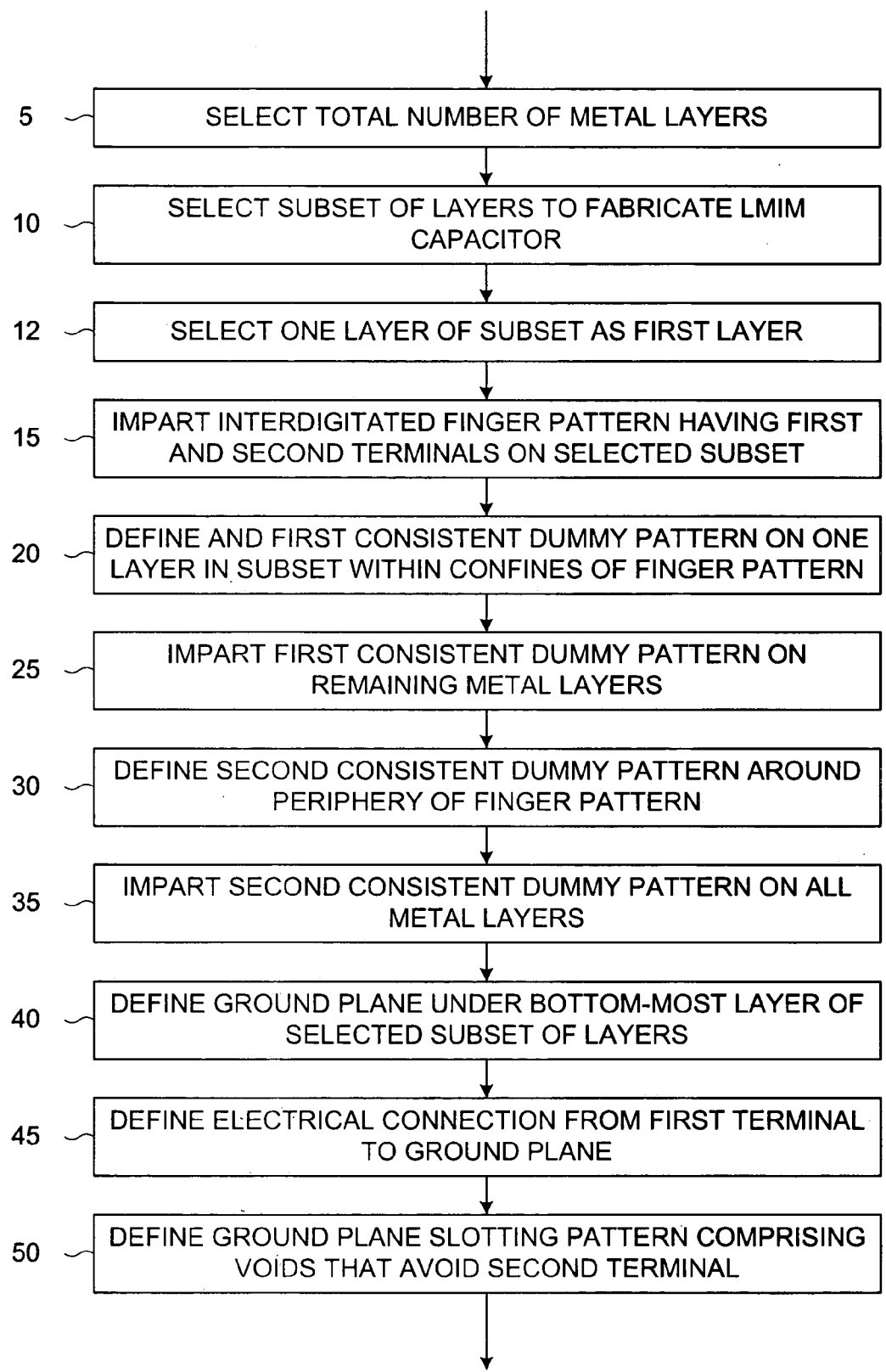
FIG. 1 is a flow diagram that illustrates one example method of fabricating an LMIM capacitor according to the present invention.

FIG. 1 is a flow diagram that illustrates one example method of fabricating an LMIM capacitor according to the present invention. This variation of the method comprises selecting a predetermined number of metal layers for an integrated circuit process (step 5). A subset of the predetermined set of metal layers is selected for use in fabricating the LMIM capacitor (step 10). The selected subset of layers comprises one layer arbitrarily designated as the first layer (step 12). According to one illustrative embodiment of the present invention, the first layer is the bottommost of the selected layers. The predetermined number of metal layers frequently is dictated by considerations separate from the design considerations that relate to an LMIM capacitor. For example, a total of six metal layers may be required as dictated by other factors. The predetermined number of metal layers required to design a specified capacitor may be four or five according to one example. Different circuits require different values of capacitance. The required value of capacitance relates to the area required to implement the LMIM capacitor. Fewer or more layers may be required in a circuit, depending upon the necessary amount of area.

These examples are chosen for illustrative purposes only and do not limit the intended scope of the present invention. The present variation of the method further comprises imparting an active interdigitated finger pattern onto the selected subset of layers with said interdigitated finger pattern having a first and second terminal (step 15). One possible way to orient the finger patterns is described in FIG. 4 infra.

With the interdigitated finger pattern in place, the implementation of a prior art LMIM capacitor would be complete. However, the present invention teaches that parasitic effects may exist above, below, and around the periphery of the LMIM capacitor. Therefore, according another aspect of the present method, a first consistent dummy pattern of metal is defined on the first layer of the subset (step 20). The pattern is defined within the confines of the active interdigitated finger pattern. This variation of the present method further provides for imparting the first consistent dummy pattern onto all remaining metal layers (step 25). The term, "remaining layers" is meant to refer to all layers that are not included in the subset of layers where the LMIM capacitor is located. The step of imparting the first consistent dummy pattern onto the remaining layers provides control of parasitics above and below the LMIM capacitor.

According to one alternative variation of the present method, the first consistent dummy pattern is defined as an alternating metal pattern within the overlap portion of the interdigitated finger pattern. The overlap portion of the interdigitated finger pattern may be viewed as an imaginary rectangular fence that encloses the interdigitated finger pattern. Extending the fence above and below the interdigitated finger pattern defines the overlap portion. In one embodiment of the present invention, the dummy pattern comprises passive metal islands where the metal content of the islands is consistent with the rules of the integrated circuit design process. It should be understood that the precise form of the dummy pattern is not as important as is the regularity and consistency of the pattern. The purpose of the consistent dummy pattern is to create a predictable and repeatable parasitic effect that varies only slightly from one LMIM capacitor to another. That is, two or more identical LMIM capacitors in the same circuit would use the same dummy pattern. Using the same dummy pattern for each LMIM capacitor tends to assure that each LMIM capacitor has nearly identical parasitic properties. Assuring that each LMIM capacitor has the same parasitic properties provides assurance that each LMIM capacitor in the circuit will perform in the same way as the others.

Parasitics around the periphery of the LMIM capacitor also need to be controlled for reasons already explained. Accordingly, one alternative variation of the present method provides that a second consistent dummy pattern is defined to occupy the area around the periphery of the active interdigitated finger pattern (step 30). This second consistent dummy pattern is imparted to all metal layers of the integrated circuit design (step 35).

Process design rules generally do not permit a large ground plane to underlie an LMIM capacitor. However, a large ground plane is necessary in order to provide proper isolation of the LMIM capacitor from the substrate of the integrated circuit. One alternative variation of the method of the present invention solves this problem by further defining a ground plane that lies substantially under the bottommost layer of the subset of layers that contain the LMIM capacitor (step 40). This alternative variation of the method further provides for defining an electrical connection from the first terminal of the capacitor to the ground plane (step 45). Another alternative variation of the method further provides that a predefined slotting pattern is created in the ground plane, said slotting pattern comprising voids in the ground plane (step 50) in order to conform the ground plane to process design rules. The slotting pattern should avoid the second terminal of the interdigitated finger pattern. Including such a pre-defined pattern in the design tends to improve the predictability and repeatability of LMIM capacitor performance when compared against designs without such predefined patterns. This predefined pattern meets the requirement of providing, in a repeatable manner, a large ground plane without violating process design rules for metal density.

Figure 2:
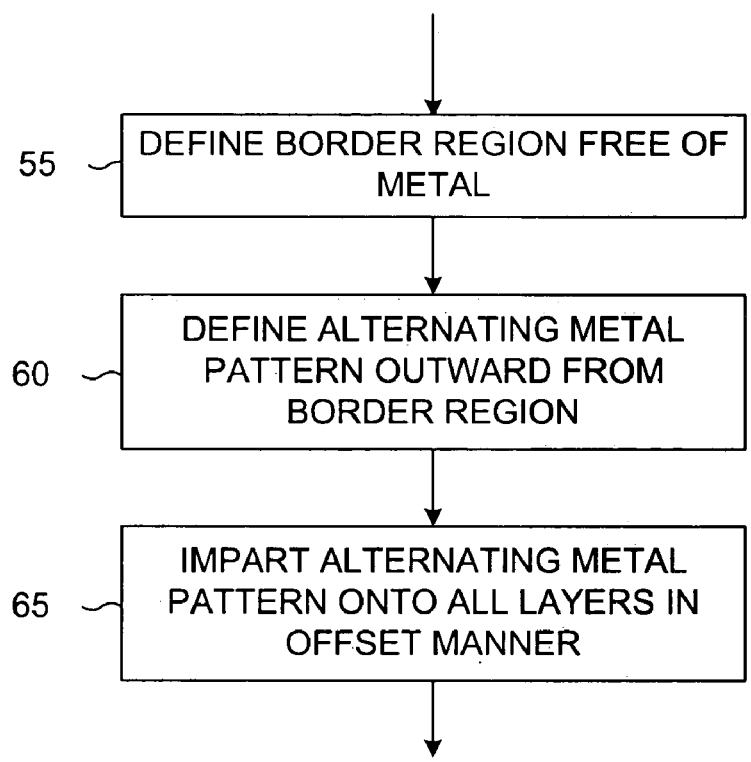
FIG. 2 is a flow diagram that describes one alternative variation of the method of the present invention whereby a second consistent dummy pattern is defined.

FIG. 2 is a flow diagram that describes one alternative variation of the method of the present invention whereby a second consistent dummy pattern is defined. According to this alternative variation of the method, a metal-free region comprising a border around the periphery of the LMIM capacitor is defined (step 55). The width of this border, according to one alternative embodiment, is approximately one to four times the thickness of the dielectric that separates the top-most metal layer in the selected subset and the layer directly above that layer. The border extends about the periphery of the interdigitated finger pattern. The border further extends along feed-lines that connect to the terminals of the LMIM capacitor. This alternative variation of the method further defines an alternating metal pattern that extends outward from the border region (step 60). The method further comprises the step of imparting the alternating metal pattern onto all of the metal layers in an offset manner consistent with the process design rules (step 65).

Figure 3:
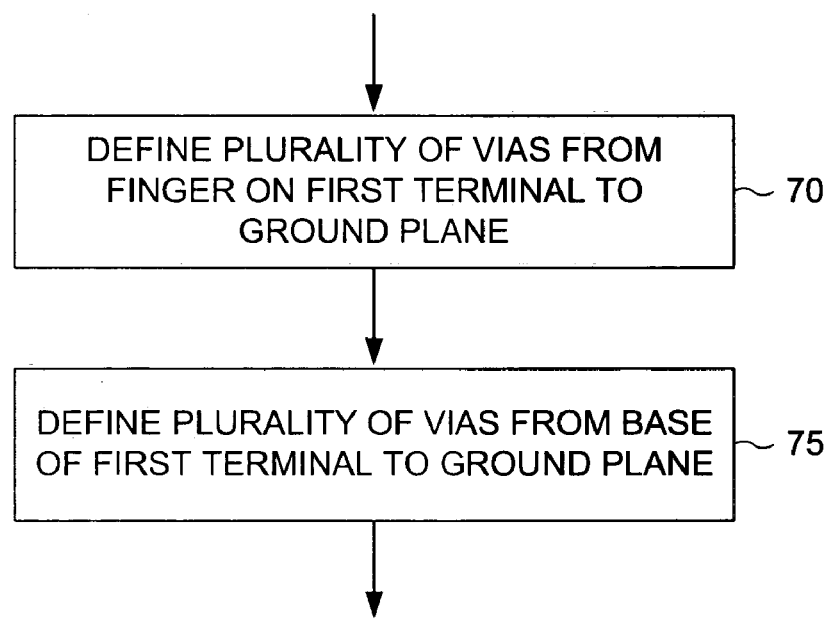
FIG. 3 is a flow diagram that depicts one alternative method for defining an electrical connection from the first terminal to the ground plane according to the present invention.

FIG. 3 is a flow diagram that depicts one alternative method for defining an electrical connection from a first terminal to a ground plane according to the present invention. According to this alternative variation of the method, a plurality of vias (metal connection paths that extend from one layer to another) are used to connect a finger on the first terminal to the ground plane (step 70). The vias, according to this alternative variation, alternate with the placement of the voids created in the ground plane. This alternative variation of the present method further teaches that a plurality of vias also is provided from the base of the first terminal to the ground plane. Inclusion of these vias helps to guarantee that the ground plane is at the same uniform potential as that of the first terminal. When the ground plane is at the same uniform potential as that of the first terminal, isolation between the first terminal and the substrate is improved. Improved isolation makes the performance of the LMIM capacitor more predictable than would otherwise be the case.

Figure 4A:
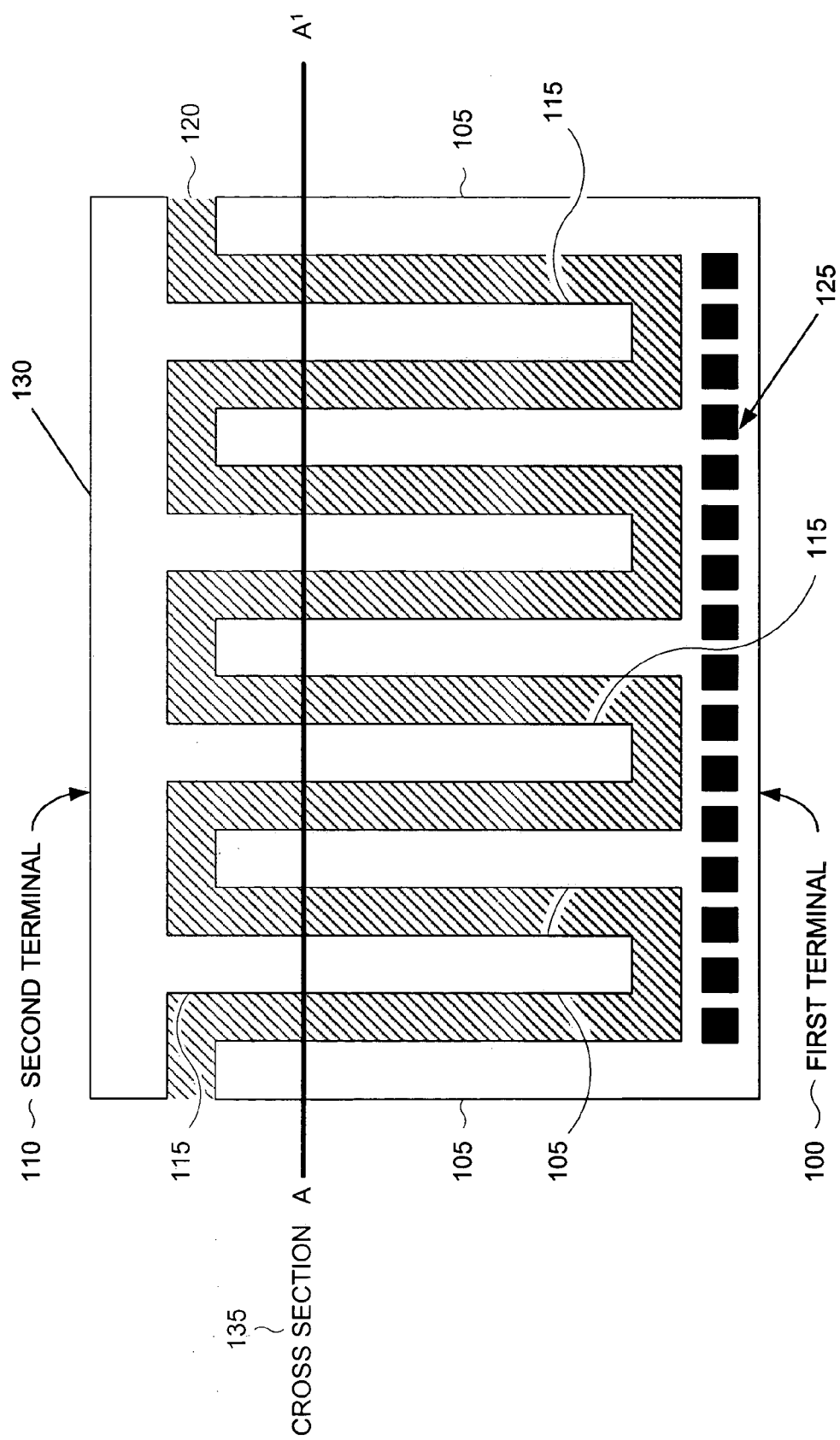
FIG. 4A is a pictorial representation of a top view of the layout of one example embodiment of a lateral metal-insulator-metal (LMIM) capacitor produced according to the method of the present invention.

FIG. 4A is a pictorial representation of a top view of the layout of one example embodiment of a lateral metal-insulator-metal (LMIM) capacitor produced according to the method of the present invention. The layout depicts the topmost layer of the LMIM capacitor. This topmost layer comprises an active interdigitated finger pattern having a first terminal and a second terminal. Describing this example embodiment in more detail, the topmost layer comprises a first terminal 100 fabricated of metal. The first terminal 100 is connected to a first collection of fingers 105. This embodiment of the LMIM capacitor further comprises a second terminal 110. The second terminal 110 also is fabricated of metal. The second terminal 110 is connected to a second collection of fingers 115.

Figure 4B:
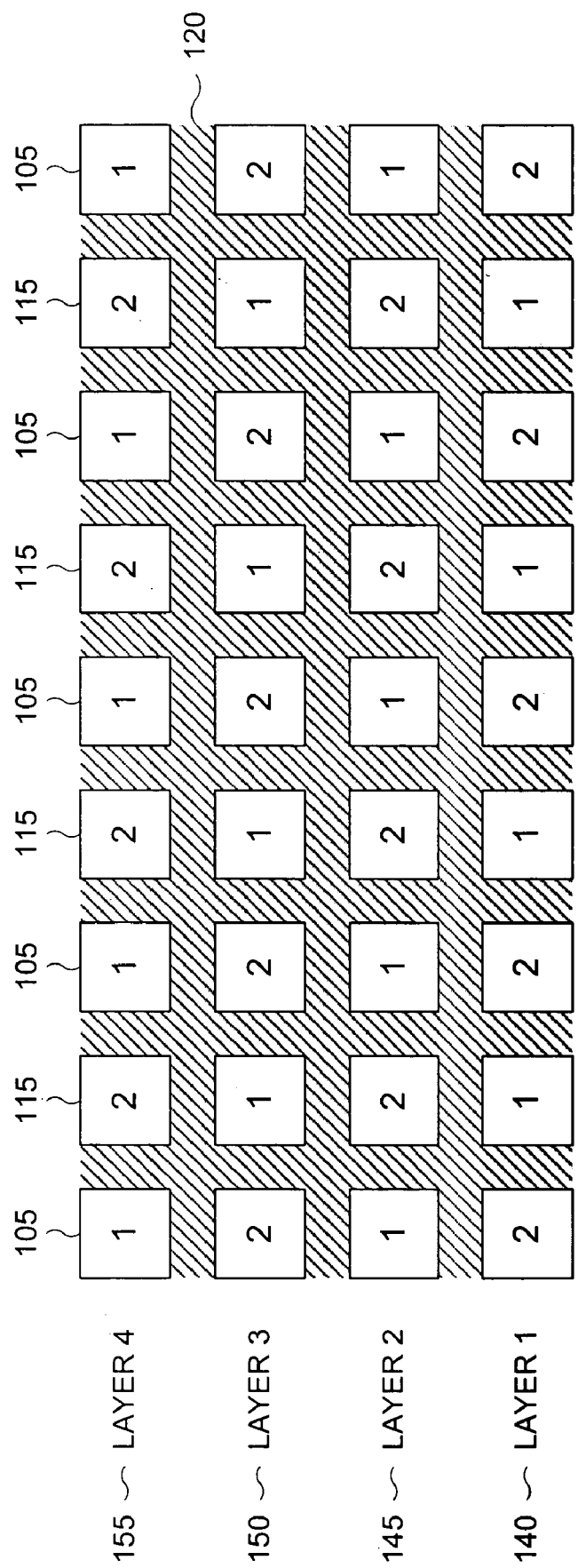
FIG. 4B is pictorial diagram portraying a cross-sectional cut through the present embodiment of the LMIM capacitor taken through section A–A'.

FIG. 4B is pictorial diagram portraying a cross-sectional cut through the present embodiment of the LMIM capacitor taken through section A-A' 135 in FIG. 4A. This embodiment comprises an active interdigitated finger pattern comprising four layers (140, 145, 150, 155). All layers of the first terminal 100 are interconnected by a plurality of vias 125 in FIG. 4A. A "via" is a metal connection between elements that occupy different layers of an integrated circuit. All layers of the second terminal 110 also are interconnected by a plurality of vias 130 in FIG. 4A. Layer 1 140 of the LMIM capacitor comprises fingers that alternate as 2, 1, 2, 1, . . . Layer 2 145 of the LMIM capacitor comprises fingers that alternate as 1, 2, 1, 2, . . . The same regular repeating pattern continues through layer 3 150 and layer 4 155. The area 120 between the metal fingers of the LMIM capacitor is occupied by insulating (dielectric) material. The integrated circuit that supports the example embodiment of the LMIM capacitor illustrated in FIG. 4A and FIG. 4B comprises a total of six metal layers. This number of metal layers is chosen according to the integrated circuit process. From the total of six metal layers, four metal layers comprise a subset of the total metal layers. These four metal layers are used to fabricate the LMIM. The present choice of six total metal layers and four metal layers for the LMIM capacitor is for illustration only and does not restrict the intended scope of the present invention. In fact, the only restriction on the relationship between the predetermined number of metal layers and the number of metal layers in an LMIM capacitor is that the number of LMIM capacitor layers must be less than or equal to the predetermined number of metal layers available for a particular design.

Figure 5:
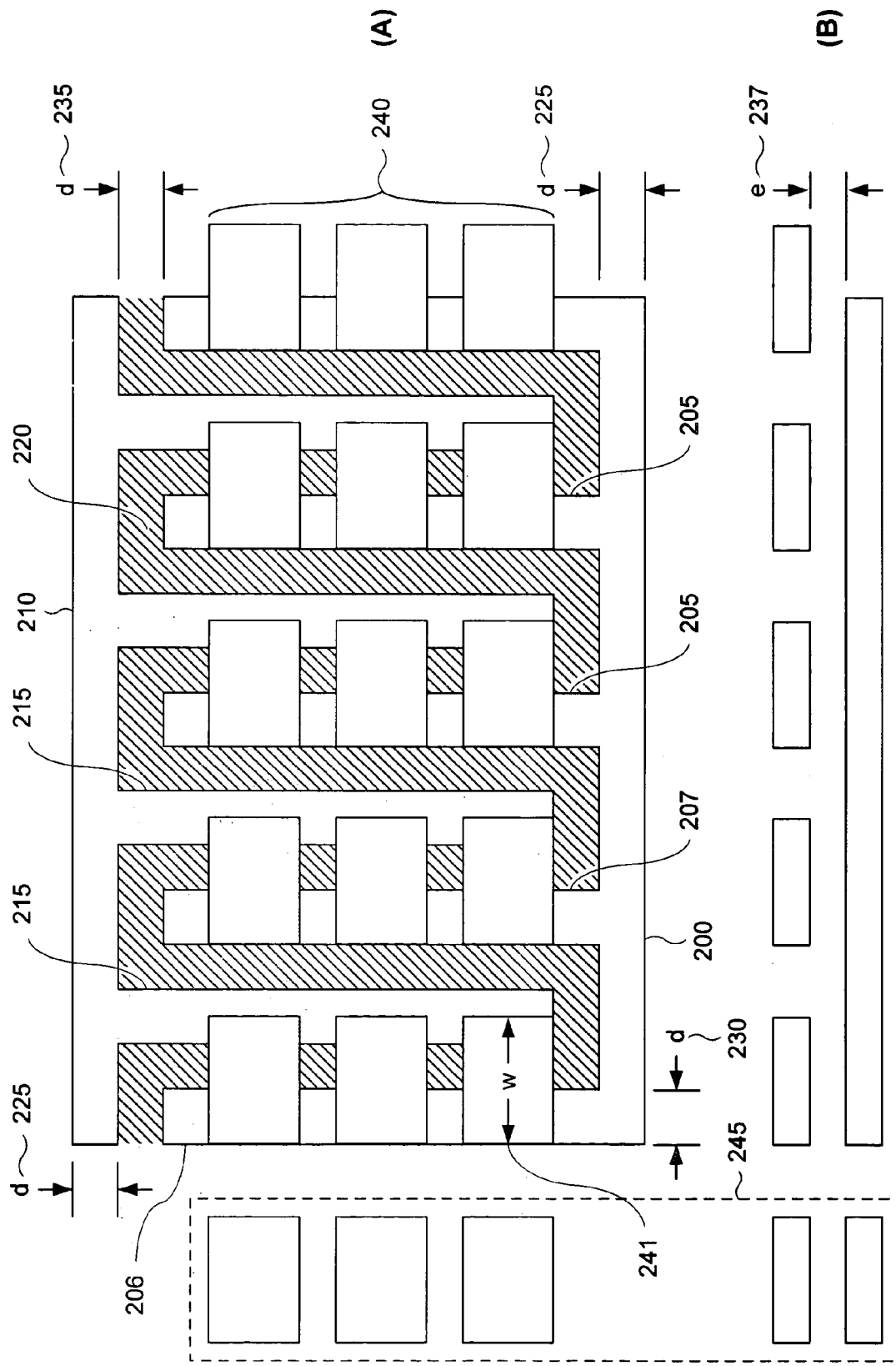
FIG. 5 is a pictorial diagram of one embodiment of a layout of an LMIM capacitor.

FIG. 5 is a pictorial diagram of one embodiment of a layout of one layer of an LMIM capacitor. This example embodiment includes consistent dummy metal patterns. FIG. 5A illustrates a top view of the embodiment and its associated consistent dummy pattern. FIG. 5B shows a front cross-section view of the same structure. This example embodiment of an LMIM capacitor comprises a topmost layer that comprises a first terminal 200 with associated fingers 205. The example embodiment further comprises a second terminal 210 with associated fingers 215. The collection of fingers 205 associated with said first terminal 200 comprises a first finger 206. The collection of fingers 205 further comprises a second finger 207. The terminals (200, 210) and fingers (205, 215) are fabricated of metal and form an interdigitated pattern as described supra. Dielectric material 220 separates the metal that comprises the first terminal 200 and its associated fingers 205 from the metal that comprises the second terminal 210 and its associated fingers 215. According to one particular example, the width 225 of the first and second terminals is d, and the width of the fingers 230 also is d. In this same example, the width of the intra-finger dielectric material 235 likewise is d. These dimensions are chosen only for purposes of illustration and are not intended to limit the scope of the present invention.

This example embodiment of the LMIM capacitor further comprises a first consistent dummy pattern 240 of alternating metal lying substantially within the confines (as viewed from the top) of the active interdigitated finger pattern but occupying only the remaining metal layers. The remaining metal layers refer to the layers that are not part of the subset of layers in which the LMIM capacitor is constructed. One layer of the dummy pattern 240, according to this example embodiment, is disposed at a distance e 237 above the top layer of the LMIM. In this diagram, e represents the thickness of the dielectric material (not shown) that separates the top layer of the LMIM capacitor from the top metal layer of the integrated circuit. The consistent dummy pattern in the example embodiment comprises an alternating metal pattern 240 within the overlap of the interdigitated finger pattern. This alternating metal pattern 240 comprises a first rectangle 241. The first rectangle 241 has a width w. In one particular embodiment, w is approximately equal to 2.5×d, although this choice of a value for w is simply one example. The first rectangle 241 is placed in a position such that its outermost edge coincides with the vertical projection of the outermost edge of first finger 206. The edge of rectangle 241 that is nearest first terminal 200 is placed at a distance approximately 2×d from the outermost edge of said first terminal 200. That is, the edge of rectangle 241 lines up with the outer edge of first terminal 200 that is perpendicular to first fingers 205.

According to one alternative embodiment of the LMIM capacitor, the consistent dummy pattern is continued by spacing additional rectangles identical to rectangle 241 at a distance d apart along the extent of the first finger 206. The pattern is continued as long as the sequence does not overlap second terminal 210. The sequence of rectangles just defined describes a basic structure that is repeated across the extent of the LMIM capacitor starting with the second finger 207 and continuing until rectangles have been placed above all first fingers of the LMIM capacitor.

One alternative embodiment of the LMIM capacitor further comprises a second consistent dummy pattern that is imparted to all metal layers around the periphery of the active interdigitated finger pattern. The second consistent dummy pattern, according to one particular example embodiment of the LMIM capacitor, includes additional rectangles 245 of dummy metal that extend outside the interdigitated finger pattern. According to this particular example embodiment, the second consistent dummy pattern is simply a continuation of the first consistent dummy pattern and continues outside the overlap of the interdigitated finger pattern. Other optional embodiments of the LMIM capacitor comprise even more additional rectangles of dummy metal (not shown in FIG. 5) placed in a manner consistent with the regular pattern established in the present example. The particular choice of spacing and placement of dummy metal rectangles is not as important as is the placing of a consistent, regular, repeatable, and well-defined pattern of metal, consistent with the dummy fill and slotting rules of the integrated circuit process employed in the design of the LMIM capacitor.

Figure 6:
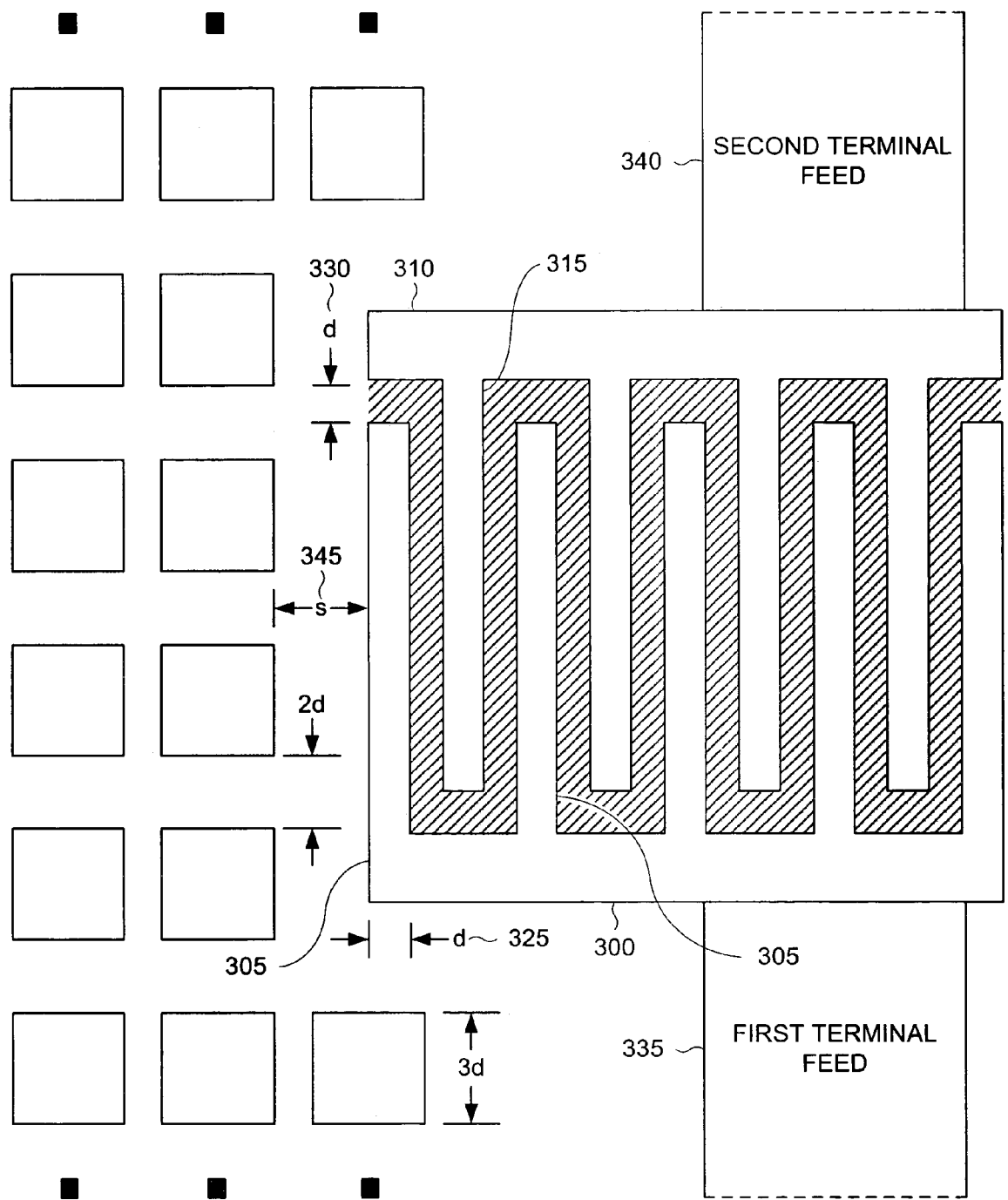
FIG. 6 is a pictorial diagram that illustrates the layout of one alternative embodiment of a LMIM capacitor having a different consistent dummy metal pattern.

FIG. 6 is a pictorial diagram that illustrates the layout of one alternative embodiment of a LMIM capacitor having a different second consistent dummy metal pattern. The first consistent dummy pattern is not shown in FIG. 6 This embodiment of the LMIM capacitor comprises first terminal 300 with connected interdigitated fingers 305 and second terminal 310 with connected interdigitated fingers 315 as already described. This embodiment of the LMIM capacitor further comprises a first terminal feed 335 and a second terminal feed 340 formed of metal connected to respective first and second terminals (300, 310) of the LMIM capacitor. The width 325 of the terminals and fingers is d. The width 330 of the dielectric material that separates first terminal 300 and fingers 305 from second terminal 310 and fingers 315 also is d. The thickness (in the vertical direction, not shown) of the dielectric material that separates the top layer of the LMIM capacitor from the top metal layer of the integrated circuit is e. According to this alternative embodiment, a border region free of metal extends about the periphery of the interdigitated finger pattern and along the feed terminals (335, 340). The width of this border region is s 345 where s 345 is approximately 1×e to 4×e. It should be emphasized that FIG. 6 is not to scale. Features are exaggerated in order to illustrate elements of the structure. Alternating metal is imparted onto all metal layers in an offset manner. The layout is arranged consistent with process design rules and extends outward from the border region.

In some exceptional examples it may be necessary to include dummy metal within a distance s 345 of the LMIM capacitor and its feed terminals. In such cases, a pre-defined dummy metal pattern is included within the distance s 345 of the LMIM capacitor, thereby making performance predictable and repeatable.

The pattern outside the border region should extend from the LMIM capacitor for a distance that depends in part upon the design rules for the integrated circuit process used in the LMIM capacitor design. According to one particular example embodiment, the process design rules include a windowing algorithm for metal density check with the window center placed on the edge of the LMIM capacitor. According to one example embodiment, a design rule check is used with a window size of 50 μm, stepped 25 μm across the layout of the integrated circuit. The present example requires an extension of the pattern for 25 μm from the LMIM capacitor. This choice of extension distance reduces the impact of nearby metal on the performance of the LMIM to a negligible level. Generally, other unrelated metal is not placed in this region in order to obtain consistent results. However, according to one particular example, unrelated metal must be placed in this region because of layout constraints. In this example, consistent results are obtained by placing the same metal in any other LMIM capacitors within the same circuit.

Figure 7:
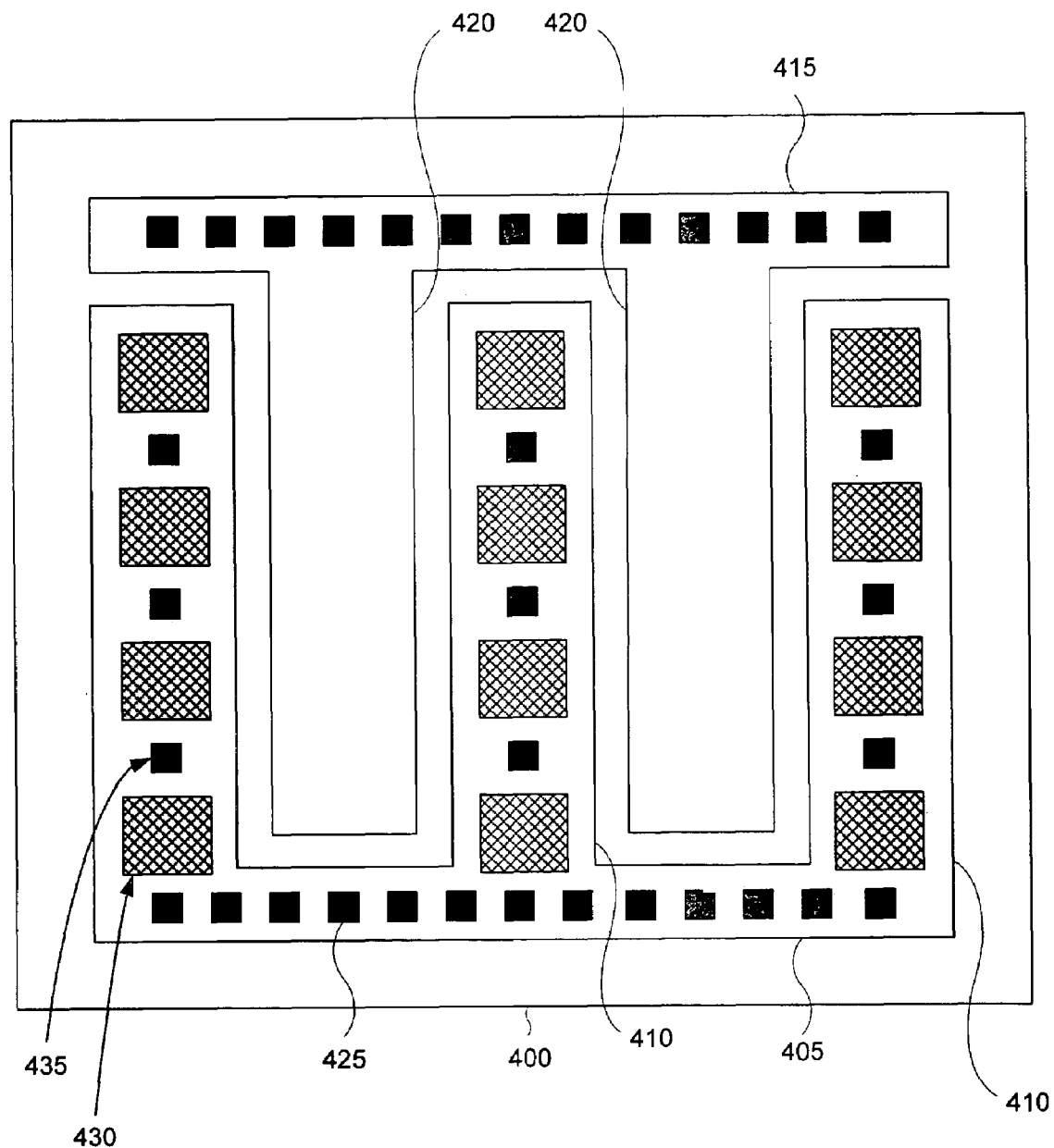
FIG. 7 is a pictorial diagram of the bottom layer of one illustrative embodiment of an LMIM capacitor fabricated according to the method of the present invention.

FIG. 7 is a pictorial diagram of the bottom layer of one illustrative embodiment of an LMIM capacitor fabricated according to the method of the present invention. According to this embodiment, the LMIM capacitor comprises a ground plane 400 that underlies the LMIM capacitor. The ground plane 400 lies near the bottom layer of the LMIM capacitor. The LMIM capacitor comprises a first terminal 405 with associated fingers 410. The LMIM capacitor further comprises a second terminal 415 with associated fingers 420. The first terminal 405 is electrically connected to the ground plane. One example embodiment of an electrical connection between the first terminal 405 to the ground plane comprises a plurality of vias 425.

As already described, inclusion of such a large ground plane normally violates process design rules. Accordingly, the present invention teaches inclusion of a plurality of regularly spaced voids in the ground plane as already described. For example, one alternative embodiment of the LMIM capacitor comprises a plurality of regularly spaced voids 430 in the ground plane placed according to a slotting pattern, said slotting pattern not to be confused with prior art. The voids are located underneath the LMIM capacitor fingers 410 that are associated with the first terminal 405. The voids further are placed so as to avoid the second terminal of 415 and its associated fingers 420. According to one example embodiment, the voids take the form of squares of width that does not exceed the width of the fingers 410 associated with first terminal 405.

Another alternative embodiment of the LMIM capacitor further comprises vias 435 that alternate with the positions of the voids in the ground plane. These vias 435 connect the fingers 410 associated with the first terminal 405 to the underlying ground plane. These vias help to assure that the first layer of the LMIM capacitor is kept at a nearly uniform potential that is substantially equal to that of the ground plane. As always, the voids in the ground plane must be chosen to satisfy the rules of the integrated circuit design process.

Alternative Embodiments

While this invention has been described in terms of several alternative methods and exemplary embodiments, it is contemplated that alternatives, modifications, permutations, and equivalents thereof will become apparent to those skilled in the art upon a reading of the specification and study of the drawings. It is therefore intended that the true spirit and scope of the present invention include all such alternatives, modifications, permutations, and equivalents.

The method of the present invention applies directly to methods for placement of dummy fill and slots that improve the predictability of performance of other types of electronic elements. Those skilled in the art will recognize that the present method applies to the design of electronic elements that include, but are not restricted to, resistors, inductors, transformers, and gyrators.

What is claimed is:

1. A lateral metal-insulator-metal capacitor produced by a manufacturing method, said manufacturing method comprising:
    selecting a predetermined number of metal layers for an integrated circuit process;
    selecting a subset of layers, said subset comprising a first layer, from the predetermined number of metal layers for use in fabricating a lateral metal-insulator-metal capacitor;
    imparting an active interdigitated finger pattern on the selected subset of layers, said interdigitated finger pattern having a first terminal and a second terminal;
    defining a first consistent dummy pattern on said first layer within the confines of the active interdigitated finger pattern;
    defining a second consistent dummy pattern around the periphery of the active interdigitated finger pattern; and
    imparting the second consistent dummy pattern to all metal layers
    wherein defining said second consistent dummy pattern comprises:
        defining a border region free of metal of approximately one to four times the thickness of the dielectric layer between the topmost metal layer in the selected subset and the layer directly above that layer, said border region extending about the periphery of the interdigitated finger pattern and along interconnect feed-lines to the terminals thereof;
        defining an alternating metal pattern outward from the border region; and
        imparting the alternating metal pattern onto all of the layers in an offset manner consistent with process design rules; and
    imparting the first consistent dummy pattern on the remaining metal layers.

2. The lateral metal-insulator-metal capacitor produced by the manufacturing method of claim 1 wherein defining a first consistent dummy pattern comprises defining an alternating metal pattern within the overlap portion of the interdigitated finger pattern.

3. The lateral metal-insulator-metal capacitor produced by the manufacturing method of claim 1 wherein said manufacturing method further comprises:
    defining a ground plane substantially under the bottom-most layer of the selected subset of layers; and
    defining an electrical connection from the first terminal to the ground plane.

4. The lateral metal-insulator-metal capacitor produced by the manufacturing method of claim 3 wherein said manufacturing method further comprises defining a slotting pattern for placing voids in the ground plane that avoid the second terminal of the interdigitated finger pattern.

5. The lateral metal-insulator-metal capacitor produced by the manufacturing method of claim 4 wherein defining an electrical connection from the first terminal to the ground plane comprises:
    defining a plurality of vias from a finger on said first terminal to the ground plane alternating with the placement of the voids; and
    defining a plurality of vias from a base of the first terminal to the ground plane.

6. A lateral metal-insulator-metal capacitor comprising:
    an active interdigitated finger pattern having a first terminal and a second terminal imparted on a selected subset of layers of an integrated circuit, said subset of layers being selected by:
        selecting a predetermined number of metal layers for an integrated circuit process, and
        selecting a subset of layers from the predetermined number of metal layers for use in fabricating a lateral metal-insulator-metal capacitor, said subset comprising a first layer;
    a first consistent dummy pattern imparted on said first layer of the subset within the confines of the active interdigitated finger pattern;
    said first consistent dummy pattern further imparted on the remaining metal layers;
    a second consistent dummy pattern imparted to all metal layers around the periphery of the active interdigitated finger pattern wherein said second consistent dummy pattern comprises border region free of metal of approximately one to four times the thickness of the dielectric layer between the top-most metal layer in the selected subset and the layer directly above that layer, said border region extending about the periphery of the interdigitated finger pattern and along interconnect feed-lines to the terminals thereof; and
    alternating metal pattern imparted onto all of the layers in an offset manner consistent with process design rules and extending outward from the border region.

7. The lateral metal-insulator-metal capacitor of claim 6 wherein the first consistent dummy pattern comprises an alternating metal pattern within the overlap of the interdigitated finger pattern.

8. The lateral metal-insulator-metal capacitor of claim 6 further comprising:
    ground plane disposed substantially under the bottom-most layer of the selected subset of layers; and
    electrical connection that connects the first terminal to the ground plane.

9. The lateral metal-insulator-metal capacitor of claim 8 further comprising voids in the ground plane placed according to a slotting pattern that avoids the second terminal of the interdigitated finger pattern.

10. The lateral metal-insulator-metal capacitor of claim 9 wherein the electrical connection that connects the first terminal to the ground plane comprises:
    plurality of vias from a finger on said first terminal to the ground plane alternating with the placement of the voids; and
    plurality of vias from a base of the first terminal to the ground plane.

* * * * *